United States Patent [19]

Ovshinsky

[11] Patent Number: 4,678,679
[45] Date of Patent: Jul. 7, 1987

[54] CONTINUOUS DEPOSITION OF ACTIVATED PROCESS GASES

[75] Inventor: Stanford R. Ovshinsky, Bloomfield Hills, Mich.

[73] Assignee: Energy Conversion Devices, Inc., Troy, Mich.

[21] Appl. No.: 623,858

[22] Filed: Jun. 25, 1984

[51] Int. Cl.⁴ .............................................. B05D 3/06
[52] U.S. Cl. ...................................... 427/38; 427/39; 427/17; 427/55; 427/294
[58] Field of Search ..................... 427/39, 38, 294, 55, 427/47

[56] References Cited

U.S. PATENT DOCUMENTS 4,217,374 8/1980 Ovshinsky et al. .................. 427/39

Primary Examiner—Bernard D. Pianalto
Attorney, Agent, or Firm—Marvin S. Siskind; Richard M. Goldman

[57] ABSTRACT

Apparatus for and a method of continuously depositing semiconductor alloy material characterized by stress-free bonds, tetrahedral coordination and a low density of defect states. The semiconductor material is deposited onto the substrate from energetic precursor process gas, density of states reducing elements, as well as dopant gas and compensating elements. Each of said energized species are discretely introduced into a deposition region for uncontaminated deposition and surface reaction on the substrate.

26 Claims, 4 Drawing Figures

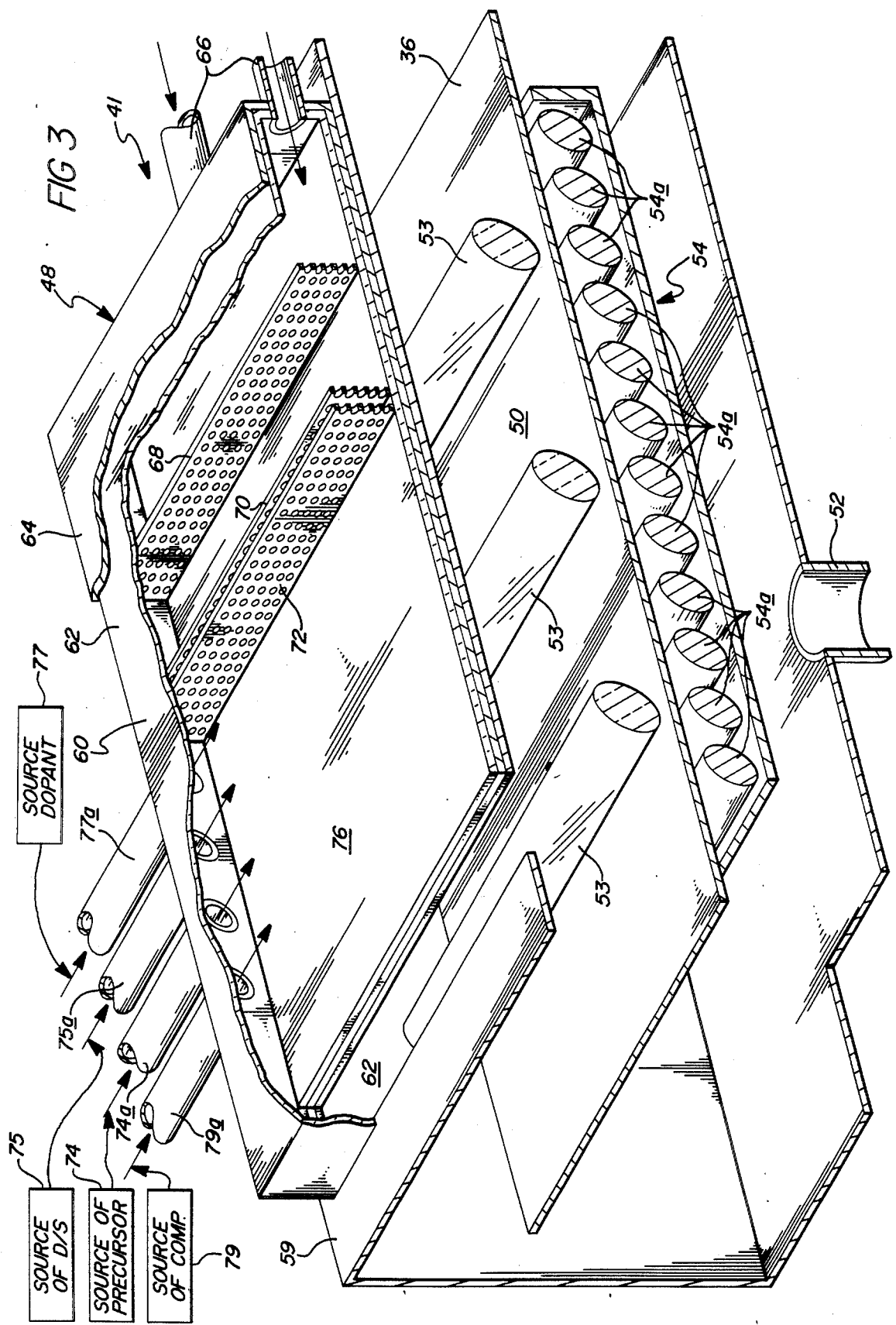

4,678,679

CONTINUOUS DEPOSITION OF ACTIVATED PROCESS GASES

FIELD OF THE INVENTION

This invention relates generally to methods of and apparatus for depositing thin films. More particularly, this invention relates to a method of and apparatus for activating precursor process gases so as to deposit a thin film of solid material upon a substrate. The invention has particular utility in the fabrication of thin films of semiconductor material, and may be advantageously employed in the manufacture of a wide variety of semiconductor devices such as, for example, microelectronic devices, photoconductive devices and photovoltaic devices, etc.

BACKGROUND OF THE INVENTION

Vacuum deposition techniques are commonly employed for the laboratory and industrial preparation of thin films from a compositionally wide range of precursor materials, said thin films specifically including films from which semiconductor devices are fabricated. It is to be noted that the term "vacuum deposition" is a broad term and encompasses a wide variety of deposition techniques such as evaporation, chemical vapor deposition, glow discharge, reactive evaporation, d.c. sputtering, diode sputtering, triode sputtering and the like, (it only being necessary that a material is deposited upon a substrate at reduced pressure).

Even vacuum deposition techniques which have attained wide acceptance and commercial implementation suffer from particular inadequacies, which inadequacies limit the utility thereof to specific areas or to specific materials. For example: while vacuum evaporation techniques are generally simple to implement and easy to control, said evaporation techniques require high deposition temperatures and are thereby limited with regard to the materials which may be prepared, since many alloys, mixtures and compounds decompose or disproportionate when heated to high temperatures; additionally, the high temperatures associated with evaporation processes may damage or degrade the substrate or previously deposited layers, upon which the material is deposited. Chemical vapor deposition processes (CVD) rely upon the reaction of the vapors of a precursor chemical reactant with a heated substrate surface to cause the deposition of a material onto that surface. Like evaporation processes, CVD techniques are limited in utility by the generally high process temperatures involved, since the substrate must be maintained at a temperature sufficient to effect chemical reaction of the deposition species. While semiconductor layers have been produced by CVD, such materials have not exhibited properties adequate for photovoltaic applications. For example, CVD produced silicon:hydrogen materials do not have proper bonding configurations for the silicon and hydrogen, and are inferior materials. While the various sputtering techniques, referred to hereinabove, are commercially employed for the preparation of thin films, sputtering processes are often not adapted for the deposition of high quality, thin film, semiconductor alloy layers since the energetic impingement (an actual bombardment) of the ionized material deposited upon the substrate tends to introduce bonding and other defects which have an adverse effect upon the chemical, electrical and/or optical properties of said deposited material.

Glow discharge techniques for the deposition of thin films of materials such as semiconductor alloys offer a partial solution to some of the problems associated with the aforementioned and briefly described vapor deposition processes. As is known to those of ordinary skill in the art of glow discharge deposition, a relatively low pressure atmosphere of precursor reactant gases is excited by a field of electromagnetic energy so as to develop an ionized plasma which is then deposited onto a proximately disposed, grounded substrate. Chemical reaction of the precursor reactant gases occurs in the ionized plasma causing the deposition of a thin film of material characterized by specifically tailored properties. More specifically, through the judicious selection of the precursor reactant gas mixture, as well as the deposition parameters, the chemical composition and bonding characteristics, and hence the chemical, electrical, and optical properties of the deposited film may be, to some extent, controlled. In glow discharge deposition processes, (which are sometimes regarded as a type of chemical vapor deposition), the substrate may be maintained at a lower temperature than in conventional CVD processes, thus avoiding heat damage to either the substrate or to the thin films of material deposited thereon.

Thus, while glow discharge deposition techniques provide for greater control and are capable of eliminating many problems associated with the other vacuum deposition processes, said glow discharge techniques are still limited insofar as the chemical reaction which occurs in the excited plasma is neither fully understood nor can said chemical reaction be fully controlled. The lack of complete controllability of the plasma reaction results in the likely deposition of thin films of material having (1) an undesirable stoichiometry, (2) an undesirable configuration of the constituent atoms, (3) stressed and strained chemical bonds; or (4) an undesirably high number of defect states in the band gap thereof, said undesirable traits being manifested in less than optimal electrical, chemical or optical performance of the devices which incorporate such materials (for instance, semiconductor devices which include thin film semiconductor alloy layers).

In addition to the problems discussed hereinabove, most prior art vacuum deposition techniques require the existence of relatively high vacuum pressures, i.e. one torr or greater, in the deposition region. These high pressures are necessary in order to insure a minimum reaction and/or deposition rate; however, and as should be apparent to ordinarily skilled routineers, these relatively high vacuum pressures also provide for undesirable side reactions of the precursor reactant gases with other available reactants, which reactions result in the introduction of impurities in the chemical composition of the deposited material, said impurities being responsible for deleteriously affecting the chemical, electrical and optical properties of the deposited thin films. The presence of impurities is of critical importance in the fabrication of semiconductor alloys for photovoltaic devices. For example, the primary semiconductor material, for instance silicon, greedily accepts any oxygen atoms present in the deposition environment, therefore, the introduction of oxygen into the matrix of the semiconductor material occurs preferentially to the introduction of density of states reducing elements, dopants, or band gap modifying elements thereinto. Furthermore, the introduction of impurities such as oxygen, which impurities are bountiful in the deposition apparatus, cannot be tolerated if high efficiency devices are to be produced.

It should thus be apparent that prior art vacuum deposition technology has yet to be developed for the commercial, high-speed preparation of thin films, especially thin semiconductor alloy films, which: (1) substantially eliminates damage to low melting point substrates or to subjacent low melting point films deposited on the substrate, (2) is capable of depositing said films in a high vacuum environment formed in the deposition region so as to substantially eliminate the inclusion of impurities and, hence reduce the number of defects states in the energy gap of the deposited film; (3) is capable selectively activating a wide variety of precursor reaction gases so as to provide for substantial control of both the stoichiometry, and the atomic configuration, as well as the chemical, electrical and optical properties of the deposited film; and (4) is capable of depositing substantially stress-free, unstrained, low density of defect states, highly photoconductive films of deposited semiconductor alloy material.

U.S. Pat. No. 4,217,374 of Ovshinsky and Izu, entitled "Amorphous Semiconductors Equivalent to Crystalline Semiconductors", which patent is assigned to the Assignee of the instant invention and the disclosure of which is incorporated herein by reference, discloses a vacuum deposition method for preparing amorphous semiconductor alloy materials which exhibit a reduced density of defect states. According to the method described by Ovshinsky and Izu, a semiconductor host material is vacuum deposited onto a substrate and a plurality of complimentary compensating agents, including hydrogen and fluorine, are provided in activated form to the matrix of the semiconductor host material. These subsequently provided compensating agents are adapted to reduce the density of localized states in the energy gap of the host material, thereby providing for the fabrication of an improved semiconductor alloy material. The activated hydrogen and fluorine have proved to (1) significantly reduce if not totally eliminate, the porosity of the deposited semiconductor alloy film, (2) substantially reduce the density of defect states in the energy gap of the deposited film, and (3) generally improve the electronic, chemical and optical properties of that deposited semiconductor alloy film, thereby making that film suitable for use in photovoltaic cells and in other current control applications.

U.S. patent application Ser. No. 514,688 of S. R. Ovshinsky, filed Jul. 18, 1983, entitled "Enhanced Narrow Band Gap Alloys For Photovoltaic Applications", which application is assigned to the Assignee of the instant invention and the disclosure of which is incorporated herein by reference, discloses a method of producing an amorphous narrow band gap photoresponsive alloy from a primary semiconductor alloy forming material and at least one density of states reducing element. According to the teaching of Ovshinsky in the aforementioned patent application, it is essential to force the primary semiconductor alloy forming material into a four-fold, i.e. tetrahedral, bonding configuration with the density of states reducing element in order to alleviate stressed and strained bonds and reduce the density of defect states in the energy gap of the semiconductor alloy, thereby achieving optimum photoresponsive properties from said deposited semiconductor alloy. According to the method of deposition proposed in the Ovshinsky patent application, the primary semiconductor alloy forming material and the density of states reducing element are introduced into the deposition region in free radical form for reaction and combination at the surface of a proximately disposed substrate so as to deposit a relaxed, tetrahedrally coordinated film of semiconductor alloy material thereupon. As described in the Ovshinsky patent application, the depositing species may be excited to free radical form by an energy source such as a laser, microwave generator, radio frequency generator, electron beam gun, x-ray beam generator, ultraviolet light, photoexcitation or ultrasonic energy. As is also disclosed in said application, one or more of the gaseous reactants may be introduced into the deposition region for reaction on the deposition surface of the substrate as an ionized species. Further, and importantly, in order to substantially prevent contamination of the depositing narrow band gap semiconductor alloy, the deposition chamber of Ovshinsky, is maintained at an ultra-high vacuum pressure of $10^{-7}$ to $10^{-9}$ torr. In summary, the invention disclosed and detailed in the Ovshinsky patent application provides for the deposition of relatively stress-free, tetrahedrally coordinated, narrow band gap semiconductor alloys which exhibit improved electrical, chemical and optical properties.

In order to better understand the method of and apparatus for depositing high quality semiconductor films disclosed herein, it is necessary to appreciate that prior to the invention described in U.S. patent application Ser. No. 514,688 fluorine and hydrogen were first used, by the assignee of the instant invention, to compensate the dangling bonds and other defect states present in amorphous silicon, thereby producing photovoltaic alloys and devices. However, in some cases it has proven especially difficult for hydrogen and fluorine to satisfactorily provide a compensating function when employed in combination with other semiconductor alloys such as germanium alloys, tin alloys, lead alloys, etc. (hereinafter also referred to, along with silicon alloys, as "primary materials") for producing a narrow band gap material. (As used herein, compensation will be defined not only as the elimination of the dangling bonds in a primary material, but also the development of a new chemical configuration in which no dangling bonds are present.) Applicant has identified the failure of fluorine and hydrogen to compensate for the dangling bonds of narrow band gap materials as being directly associated with the tendency of germanium, tin and lead to become divalent or assume other nontetrahedral configurations. More particularly, the aforementioned patent application sought to minimize or eliminate the tendency of such narrow band gap materials to assume distorted tetrahedral, divalent or other nontetrahedral coordination caused by the presence of an "inert pair" of valence electrons formed when two of the four valence electrons of said narrow band gap materials exhibit decreased reactivity. The problem was solved, and improved semiconductor material were obtained by exciting or activating the inert pair so as to expand the coordination thereof so that the inert pair will assume a configuration which permits the use thereof in bonding with the compensating element. In other words excitation of the precursor reaction gases provides for the expansion of the coordination of the lone or inert pair of valence electrons and results in the production of low band gap materials exhibiting a low density of defect states (less than $10^{16} cm^{-3}(eV)^{-1}$) in the energy gaps thereof.

The instant invention provides a method of and apparatus for the preparation and deposition of thin films of a wide variety of materials, said deposited films exhibiting a low density of defect states in the band gaps thereof, and characterized by specifically preselected chemical, physical, configurational and electronic properties. And importantly, the specifically tailored films are producible by a process which does not damage either the substrate or the thin film layers of material which have previously been deposited upon the substrate. According to the disclosed method of the instant invention, discrete, relatively high pressure activation regions are provided in the deposition chamber for exciting the precursor reactant gas, the states reducing elements, the compensating elements, etc. while a lower pressure deposition region is provided in proximity thereto for depositing and reacting the activated species. By introducing only discrete, excited reactant gases into the deposition region at judiciously selected temperature and pressure levels, stress-free, tetrahedrally coordinated, low density of defect states semiconductor alloy films can be deposited onto a proximately disposed substrate at a high rate of deposition, while minimizing contamination of the deposited semiconductor alloy.

It is to be noted that the terms "activated" or "excited", as used herein, will refer to a material, such as a precursor gaseous reactant which has undergone an increase in its level of energy, as for example, by being ionized, radicalized, electronically excited, thermally excited, photoexcited or any combination thereof. Activation may occur due to an input of electrical, chemical, thermal, mechanical, or optical energy. More specifically, in one preferred embodiment of the invention which will be described in detail hereinbelow, a flux of energetic gas is directed to impinge upon the precursor reaction gases, the states reducing elements, etc. which are introduced into the discrete activation regions of the deposition apparatus, thereby exciting said precursor gases and states reducing elements so as to promote the deposition and surface combination of the gaseous species while said gaseous species remain in an excited state.

Recently, considerable efforts have been made to develop systems for depositing amorphous semiconductor alloy materials, each of which can encompass relatively large areas, and which can be utilized to produce a wide variety of electronic devices such as photovoltaic devices which are, in operation, substantially equivalent to their crystalline counterparts. It is to be noted that the term "amorphous", as used herein, includes all materials or alloys which have long range disorder, although they may have short or intermediate range order or even contain, at times, crystalline inclusions. The instant invention is especially well suited for the deposition of amorphous alloys and has great utility in fabrication of electronic devices from those alloys.

It is now possible to prepare amorphous alloys such as silicon alloys by glow discharge deposition or other vacuum deposition techniques, said alloys possessing (1) acceptable concentrations of localized states in the energy gaps thereof, and (2) high quality electronic properties. Such techniques are fully described in U.S. Pat. No. 4,226,898, entitled "Amorphous Semiconductors Equivalent To Crystalline Semiconductors", issued to Stanford R. Ovshinsky and Arun Madan on Oct. 7, 1980; and the aforementioned U.S. Pat. No. 4,217,374; as well as U.S. patent application Ser. No. 423,424 of Stanford R. Ovshinsky, David D. Allred, Lee Walter, and Stephen J. Hudgens entitled "Method Of Making Amorphous Semiconductor Alloys And Devices Using Microwave Energy". As disclosed in these patents and application, fluorine introduced into the amorphous silicon semiconductor layers operates to substantially reduce the density of the localized states therein and facilitates the addition of other alloying materials, such as germanium. The techniques of the instant invention may be advantageously employed either alone, or with the methods and apparatus of the aforementioned patents and application to fabricate amorphous semiconductor alloys that are still further improved.

It must be stressed that the instant patent application differs from the 514,666 patent application by disclosing specifically designed apparatus and a particularly tailored process for the deposition of thin films of semiconductor alloy material which are characterized by stress-free bonding, tetrahedral coordination, a low density of defect states in the energy gap and desirable photoconductive properties. It has been found that the most sensible manner in which to continuously fabricate, on a high volume basis, semiconductor alloys characterized by the aforementioned characteristics is to introduce the precursor gaseous reactants into the activation region of the apparatus for the excitation of the reactants by a flux of energetic gas. The use of energetic gas to activate the precursor gaseous reactants, the operative disposition of the activating mechanism relative to the substrate and the source of reactants, as well as all of the other necessary components of the deposition apparatus, represent features of the instant invention which particularly adapt the more conceptual and research oriented apparatus disclosed in and described by the 514,688 application, for commerical production. It should be appreciated that the design of such large area mass production apparatus involves more than a simple "scale-up" operation in that great care must be taken to (1) avoid the introduction of contaminants, (2) individually introduce the precursor gaseous reactants, states reducing elements, compensating elements, and dopant gases in activated form, and (3) discretely move the activated reactants, elements and gases to the deposition surface of the substrate so that the free radical or other excited state lifetimes thereof are not quenched prior to deposition and combination on the substrate surface as a tetrahedrally coordinated semiconductor alloy. It is therefore only the specific embodiment of the instant deposition apparatus and the corresponding method, as well as equivalent thereof, which differentiate over prior art apparatus and methods.

The concept of utilizing multiple cells, to enhance photovoltaic device efficiency, was described at least as early as 1955 by E. D. Jackson in U.S. Pat. No. 2,949,498 issued Aug. 16, 1960. The multiple cell structures therein discussed utilized p-n junction crystalline semiconductor devices. Essentially the concept employed different band gap devices to more efficiently collect various portions of the solar spectrum and to increase open circuit voltage (Voc). The tandem cell device (by definition) has two or more cells with the light directed serially through each cell. In the first cell a large band gap material absorbs only the short wavelength light, while in subsequent cells smaller band gap materials absorb the longer wavelengths of light which pass through the first cell. By substantially matching the generated currents from each cell, the overall open circuit voltage is the sum of the open circuit voltage of each cell, while the short circuit current thereof remains substantially constant. However, it is virtually impossible to match crystalline lattice constants, as is required in the multiple cell structures of the prior art. Therefore, tandem cell structures cannot be fabricated from crystalline materials in any practical way having commercial significance. As the assignee of the instant invention has shown; however, such tandem cell structures are not only possible, but can be fabricated in large areas and at low costs with amorphous materials.

Unlike crystalline silicon which is limited to batch processing for the manufacture of solar cells, amorphous alloys can be readily deposited in multiple layers over large area substrates to form solar cells in a high volume, continuous processing system. Such continuous processing systems are disclosed in U.S. Pat. No. 4,400,409 for "A Method of Making P-Doped Silicon Films"; U.S. Pat. No. 4,410,588 for "Continuous Amorphous Solar Cell Production System", and in pending patent applications: Ser. No. 244,386, filed Mar. 16, 1981, for "Continuous Systems For Depositing Amorphous Semiconductor Material"; Ser. No. 306,146, filed Sept. 28, 1981, for "Multiple Chamber Deposition And Isolation System And Method"; Ser. No. 359,825, filed Mar. 19, 1982 for "Method And Apparatus For Continuously Producing Tandem Amorphous Photovoltaic Cells"; and Ser. No. 460,629 filed Jan. 24, 1983 for "Method And Apparatus For Continuously Producing Tandem Amorphous Photovoltaic Cells". As disclosed in these patents and patent applications, the disclosures of which are incorporated herein by reference, a substrate may be continuously advanced through a succession of deposition chambers, wherein each chamber is dedicated to the deposition of a specific semiconductor material. In making a photovoltaic device of p-i-n type configurations, the first chamber is dedicated for depositing a p-type semiconductor alloy, the second chamber is dedicated for depositing an intrinsic amorphous semiconductor alloy, and the third chamber is dedicated for depositing an n-type semiconductor alloy. As will be explained in greater detail hereinbelow, the techniques of the instant invention may be adapted to continuously produce high quality semiconductor devices.

The layers of semiconductor material thus deposited in the deposition apparatus may be utilized to form a photovoltaic device including one or more p-i-n cells, one or more n-i-p cells, a Schottky barrier, photodiodes, phototransistors, or the like. Additionally, by making multiple passes through the succession of deposition chambers, or by providing an additional array of deposition chambers, multiple stacked cells of various configurations may be obtained.

Additionally, the method and apparatus of the instant invention may be employed to fabricate, on a mass production basis, a wide variety of semiconductor devices such as memory devices, photoconductive devices, diodes, transistors and the like, said devices characterized by stress-free, tetrahedrally coordinated semiconductor alloy material. These and other advantages of the instant invention will become apparent from the Brief Description of the Drawings, the Detailed Description of the Invention and the Claims which follow.

BRIEF SUMMARY OF THE INVENTION

Disclosed herein, inter alia, is apparatus for the deposition of thin films of semiconductor alloy material which have low densities of defect states, are tetrahedrally coordinated and exhibit unstressed bonds. The apparatus comprises a deposition chamber which includes therein a deposition region and a plurality of activation regions proximately disposed in spaced but operative communication with one another, a web of substrate material, a mechanism adapted to continuously move the web through the deposition region, and means for vacuumizing the deposition chamber. The apparatus further includes a source of semiconductor precursor material, a source of at least one density of states reducing element, means for individually exciting the semiconductor precursor material and the density of states reducing element in discrete activation regions by providing a discrete flux of energetic gas thereinto, and means for introducing the precursor material and states reducing element into the discrete activation regions and means for energizing the precursor material in the activation region. Finally, the apparatus includes means for directing the activated semiconductor precursor material and states reducing element into the deposition region within the lifetime of the activated species, where said activated species are deposited onto the deposition surface of the web of substrate material.

In one embodiment of the instant invention, the means for individually exciting the semiconductor precursor material and the density of states reducing elements is an ion gun (which may also be used as a free radical generator) which provides a flux of energetic gas to the activation region of the deposition chamber. The flux of energetic gas, which may be an ionized flux, a neutral flux or a flux of free radicals, is directed toward and adapted to bombard the semiconductor precursor material and states reducing elements to thereby energize said material and elements.

Also in the preferred embodiment, the means for exciting the semiconductor precursor material and the density of states reducing element may comprise a plurality of ion guns, each gun adapted to provide a flux of energetic gas. A discrete activation region is associated with each of the ion guns for the reception and energization of individual mixtures of semiconductor precursor material, states reducing elements, dopant gases, and compensating gases. In this manner, specific species of energetic gases may be generated in discrete ones of the plurality of activation regions, and only subsequently are these energetic species directed into the deposition region for deposition and combination onto the web of substrate material traveling therepast.

Also disclosed herein are methods of depositing thin films of semiconductor alloy material.

The instant invention is particularly well-suited for the deposition of a wide variety of thin film semiconductor alloy materials, and especially for the deposition of amorphous silicon and/or amorphous germanium alloy semiconductor materials. By utilizing the principles disclosed herein, semiconductor alloy layers of preselected compositional, configurational, chemical, optical and electrical properties may be continuously deposited onto the moving web of substrate material. Accordingly, the instant invention has great utility in the fabrication of amorphous semiconductor devices such as photovoltaic or other photoresponsive devices, microelectronic devices and semiconductor devices.

BRIEF DESCRIPTION OF THE DRAWINGS

FIG. 3 is an enlarged, fragmentary, perspective view, in cross-section, of a portion of a deposition chamber of the deposition apparatus depicted in FIG. 2, and specifically illustrating a preferred embodiment of the activation assembly for exciting precursor gaseous reactants and states reducing elements in accordance with the principles of the instant invention; and, FIG. 4 is an enlarged, fragmentary perspective view, in cross-section, illustrating a plurality of the spaced activation assemblies depicted in FIG. 3 for the excitation of gaseous reactants and states reducing elements, said assemblies being operatively disposed so as to introduce activated species to the deposition region for the fabrication of high quality, thin film layers of semiconductor material.

DETAILED DESCRIPTION OF THE DRAWINGS

I. The Photovolatic Cell

Figures 1, 2:
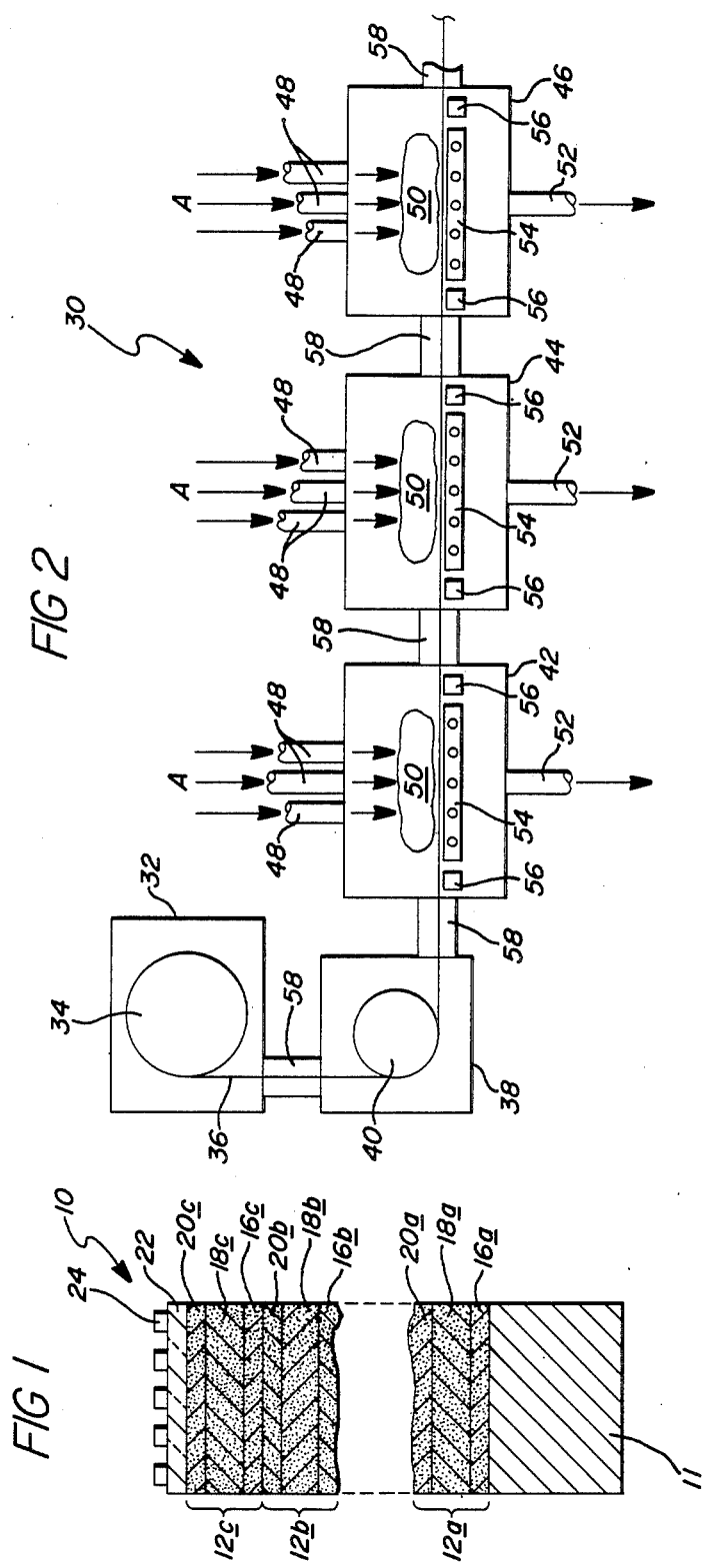
FIG. 1 is a fragmentary, cross-sectional view of a tandem photovoltaic device, said device comprising a plurality of p-i-n type cells, each layer of the cells formed from a semiconductor alloy.
FIG. 2 is a schematic depiction of continuous deposition apparatus structured in accordance with the principles of the instant invention, said apparatus adapted to continuously deposit a plurality of successive, thin film layers of semiconductor alloy material upon a continuously advancing web of substrate material.

Referring now to the drawings and particularly to FIG. 1, a photovoltaic cell formed of a plurality of successive p-i-n layers, each of which includes a semiconductor alloy is shown generally by reference numeral 10. The cell 10 is typical of the type of electronic device which may be fabricated by utilizing the principles of the instant invention; accordingly, a detailed description of the cell 10 is necessary in order to better understand the function and advantages of the improved deposition system and method of the instant invention.

More particularly, FIG. 1 shows a p-i-n photovoltaic device such as a solar cell 10 made up of individual p-i-n type cells, 12a, 12b and 12c. Below the lowermost cell 12a is a substrate 11 which (1) supports the remaining layers of the cell 10 and (2) functions as the bottom electrode of the cell. The substrate 11 may be formed of an electrically conductive material, such as a metal, or an electrically insulating material such as glass or plastic having an electrically conductive layer deposited thereupon. Although certain applications may require a thin oxide layer and/or a series of base contacts and/or a reflecting layer to be deposited upon the substrate prior to the deposition of the semiconductor material for purposes of this application, the term "substrate" shall include not only the electrically conductive supporting member but also any elements added thereto by preliminary processing.

Each of the cells, 12a, 12b, and 12c are fabricated with an amorphous semiconductor body containing at least a silicon or germanium alloy. Each of the semiconductor bodies includes an n-type conductivity semiconductor layer 20a, 20b and 20c; an intrinsic semiconductor layer 18a, 18b and 18c; and a p-type conductivity semiconductor layer 16a, 16b and 16c. As illustrated, cell 12b is an intermediate cell and, as indicated in FIG. 1, additional intermediate cells may be stacked atop the illustrated cells without departing from the spirit or scope of the present invention.

It is to be understood that following the deposition of the semiconductor layers, a further deposition process may be either performed in a separate environment or as part of a continuous process. In this step, a TCO (transparent conductive oxide) layer 22, formed in one preferred embodiment of indium tin oxide, also referred to herein as the top or upper electrode is deposited atop the semiconductor material. An electrode grid 24 may be applied to the device where the cell is of a sufficiently large area, or if the conductivity of the TCO layer 22 is insufficient. The grid 24 shortens the carrier path through the TCO and thus increases the collection efficiency.

While the cell illustrated in FIG. 1 is a stacked assembly of p-i-n cells, the instant invention may also be employed to fabricate other cell arrangements such as single p-i-n cells, stacked or single n-i-p cells, p-n cells, Schottky barrier cells, as well as other thin film semiconductor devices.

As should be apparent from the preceding discussions of the beneficial attributes of the instant invention, and the nature of a stacked photovoltaic cell, narrow band gap materials (germanium, tin or lead alloys) are most preferably utilized in a tri-layered, tandem solar cell 10 such as the cell illustrated in FIG. 1. The top cell 12c of the solar cell 10 is generally formed of a semiconductor alloy material, such as an amorphous silicon alloy, having a band gap of 1.7 to 1.9 eV, as described by U.S. Pat. Nos. 4,217,374 and 4,226,898. The second or intermediate cell 12b is generally formed of a semiconductor alloy material, such as an amorphous silicon-germanium alloy, having a band gap of 1.4 to 1.7 eV, as described in U.S. Pat. No. 4,342,044. The lowermost cell 12a is formed of a semiconductor alloy material, such as an amorphous germanium alloy, having a band gap of 0.8 to 1.3 eV (preferably about 1.1 eV).

Since one of the desirable characteristics of the deposited semiconductor alloy material is tetrahedral coordination, said coordination must be insured by the methods and apparatus described herein. To that end, numerous possible alloying materials can be utilized for changing or adjusting the band gap of semiconductor alloy layers of the solar cell 10 without increasing the density of states in the band gap thereof. The alloy materials include combinations, whether doped or undoped, of silicon and/or germanium and/or tin and/or lead. The addition of germanium as an element of the semiconductor alloy material is enhanced by the method of the present invention, since conventionally prepared thin film germanium-silicon alloys have too many defect states in the band gap for fabricating an optimum tandem photovoltaic device. In contrast thereto, the tandem solar cell 10 formed in accordance with the principles of the instant invention is capable of providing photovoltaic devices having efficiencies greater than 30%.

It should finally be noted that according to principles embodied herein, other elements which enhance tetrahedral coordination over divalent coordination may be added to the primary material and/or density of states reducing element in trace amounts. These elements defined herein (without limiting their other possible beneficial properties) as "tetrahedral coordination enhancers", not only can increase tetrahedral structure, but can (1) act as chemical compensators and (2) fill spaces to force tetrahedralness. This is accomplished due to (1) the size of the atoms introduced into the host matrix of the semiconductor alloy (2) the charge of the atoms introduced into the host matrix of the semiconductor alloy, and (3) filling all four bonding positions (for example, a divalent atom attaching itself to the divalency of germanium).

II. The Deposition Apparatus

Referring now to the drawings, FIG. 2 is a schematic depiction of deposition apparatus, generally 30, structured in accordance with the principles of the instant invention, and specifically adapted to continuously deposit thin film layers of stress-free, low density of defect states, tetrahedrally coordinated semiconductor alloy material onto the deposition surface of an elongated web of substrate material 36. The deposition apparatus 30 includes a substrate supply chamber 32, adapted to house a substrate pay-off mandril 34 about which the elongated web of substrate material 36 is wound. The deposition apparatus 30 further includes a turning chamber 38 having an idler roller 40 for directing the web of substrate material 36 to assume a substantially horizontal path of travel after exiting from the supply chamber 32. It should be noted that, while the path of travel of the web 36 will be described as being substantially horizontal, the path of travel is actually catenarized so as to assume a shallow-sag as it travels through the deposition chambers of the apparatus 30. Although not shown, either the turning chamber 38 or another upstream chamber may include substrate cleaning equipment, such as a plasma cleaning station, for cleansing at least the deposition surface of the web of substrate material 36 prior to the entry thereof into the downstream deposition chambers.

The deposition apparatus 30, as depicted herein, includes at least three deposition chambers 42, 44, and 46, each deposition chamber specifically adapted to continuously deposit a layer of semiconductor alloy material upon the web of substrate material 36 passing therethrough. It should be stressed that FIG. 2 is merely a schematic representation of the deposition apparatus, and, as such, is intended to only stylistically illustrate but a single potential embodiment for continuously depositing semiconductor alloy material for the fabrication of photovoltaic cells. Accordingly, FIG. 2 only depicts a first triad of the deposition chambers of the deposition apparatus 36, (as is evident from the break line following the third deposition chamber 46). It should be apparent that, depending upon the configuration of the electronic or semiconductor device being fabricated in the deposition apparatus, it is possible to specifically tailor said apparatus to include a specific number of deposition chambers. However, for purposes of illustration and for reasons of simplicity, the three deposition chambers, specifically adapted to deposit three layers of semiconductor material from which to fabricate a photovoltaic cell provide an enabling disclosure. The exemplary number of chambers also provide a teaching which can be modified to facilitate the deposition of any number of layers of semiconductor material for the fabrication of other electronic, semiconducting or photoresponsive devices.

The first deposition chamber 42 is adapted to deposit a layer of p-type amorphous silicon alloy semiconductor material, as one step in the fabrication of the p-i-n type photovoltaic cell (similar to the cell 10 depicted in and described with respect to FIG. 1). The deposition chamber 42 includes a plurality of spaced conduits 48 which are intended to symbolically illustrate discrete instrumentalities, each one of which is individually adapted to activate precursor process gases, density of states reducing elements, dopant gases or compensating gases and to individually direct said activated gaseous species of process gases, state reducing elements, dopant gases and compensating gases into the deposition region 50 of the deposition chamber 42, said deposition region 50 disposed proximate the web of substrate material 36. As generally alluded to hereinabove, while the activating and directing instrumentalities 48 are depicted schematically as conduits having gaseous reactants (either process gases, density of states reducing elements, dopant gases, or compensating gases), flowing therethrough, this is merely a stylized representation for convenience of illustration. A more detailed description of the method of and instrumentalities for activating the process gases, states reducing elements, dopant gases and compensating gases will follow in the detailed description of FIGS. 3-4. Since, in the illustrated embodiment, the first deposition chamber 42 is adapted to deposit a layer of p-type amorphous silicon alloy material; a primary semiconductor material selected of a silicon based process gas such as silane, disilane, silicon tetrafluoride, chlorosilane, etc., alloyed with small amounts one or more p-dopant gases such as diborane as well as any additional density of states reducing or band gap adjusting elements necessary to either (1) adjust the band gap of the silicon alloy, (2) reduce the density of states of the silicon alloy, or (3) otherwise modify the chemical, optical, mechanical, and/or electrical properties of the silicon alloy, will each be individually introduced into the activating and directing instrumentalities 48. Note that the apparatus and method described by the instant invention is readily adaptable for use with a wide variety of gaseous reactants and may be used with narrow band gap semiconductor alloy materials such as germanium.

Continuing now with the description of the deposition apparatus 30 of FIG. 2, spent gaseous reactants are exhausted from the deposition chamber 42 by means of an evacuation conduit 52 operatively connected to a vacuum pump, not shown. The control of activated process gases, dopant gases, compensating gases and density of states reducing elements going into the deposition chamber 42 relative to the evacuation of the gases from the chamber is such as to maintain a reduced pressure in the deposition 50 of the chamber. The deposition chamber 42 further includes a substrate heater 54 for maintaining the web of substrate material 36 at a preselected deposition temperature as it passes through the deposition region 50 thereof. Since, in the preferred embodiment, the web of substrate material 36 is formed from a magnetically attractable material, it is desirable to operatively dispose one or more magnets 56 so as to maintain tension thereupon for presenting a smooth deposition surface to the deposition region 50.

Downstream of the p-type deposition chamber 42 is an intrinsic deposition chamber 44 which is adapted to deposit a layer of intrinsic amorphous silicon alloy semiconductor material atop the previously deposited layer of p-type semiconductor material. The intrinsic deposition chamber 44 is generally similar to the p-type deposition chamber 42, with the primary exception that the gaseous reactants introduced thereinto will be differently composed and the deposition region 50 therein will be substantially enlarged. The additional length of the deposition region 50 is necessary because the thickness of the intrinsic semiconductor material is significantly greater than the p-type semiconductor material. The activation and directing instrumentalities 48 of the intrinsic chamber 44 are, like the instrumentalities of the p-type chamber 42 adapted to provide activated intrinsic process gases, dopant gases, compensating gases and density of states reducing elements to the deposition region 50 thereof. The intrinsic precursor reactant gases may be generally similar to those precursor gases utilized for the deposition of the p-doped layer of semiconductor alloy material except that the amount of p-dopant gas will be substantially reduced if not totally eliminated. The intrinsic deposition chamber 44 also includes an evacuation conduit 52, substrate heaters 54 and one or more magnets 56, said conduit, heaters, and magnets being structured and disposed to operate in the manner described hereinabove with respect to the p-type deposition chamber 44.

Immediately downstream of the intrinsic deposition chamber 44, the web of substrate material 36 passes through an n-type deposition chamber 46 which is generally similar to the previously described upstream deposition chambers except that it is adapted to deposit an n-type amorphous silicon alloy material onto the web of substrate material 36. The precursor process gases, dopant gases, compensating gases and density of states reducing elements are again activated and directed by instrumentalities 48 to provide activated n-type process gases, dopant gases, compensating gases and density of states reducing elements to the deposition region 50 of the deposition region 46. The n-type precursor process gas mixture is generally similar to the intrinsic precursor process gas mixture except that it also includes an n-dopant material such as phosphorous or arsenic therein. As in the preceeding chambers, the n-type deposition chamber 46 includes an evacuation conduit 52, substrate heaters 54, and one or more magnets 56, said conduit, heaters, and magnets structured and disposed to operate in the manner described hereinabove with respect to the upstream deposition chambers.

The substrate supply chamber 32, the substrate turning chamber 38 and the at least one triad of successively disposed deposition chambers 42, 44 and 46 are each operatively interconnected by gas gates 58. It is through a passageway formed in each of the gas gates 58 that the web of substrate material 36 is adapted to move while substantially preventing contamination of the atmospheres of each of the adjacent and operatively interconnected deposition chambers.

As depicted and described, the triad of deposition chambers of the deposition apparatus 30 are specifically adapted to deposit successive p-i-n-type layers of semiconductor material upon the web of substrate material 36 which continuously passes therethrough. Through the inclusion of one or more additional deposition chambers, or of an additional triad of deposition chambers, other device configurations such as a dual tandem photovoltaic cell, similar to the cell depicted in FIG. 1, and characterized by stress-free bonds, a low density of defect states and tetrahedral coordination may be fabricated in a continuous, low cost, roll-to-roll process. Furthermore, by changing the precursor mixture of process gases states reducing elements, dopant gases and compensating gases introduced into the deposition chambers, compositionally different layers of semiconductor alloy material, such as for example, substantially amorphous germanium alloy layers, substantially amorphous germanium-silicon alloy layers, cadmium telluride layers and the like may be readily formed in the deposition chambers by activation, deposition and combination on the deposition surface of the web of substrate material 36.

Turning now to FIG. 3, there is shown in a partial cross-sectional, perspective, enlarged view, of the operative components of a representative deposition chamber 41 of the apparatus 30, said components being substantially similar in function and structure to the components illustrated and described with reference to the apparatus 30 of FIG. 2. More particularly, FIG. 3 illustrates one preferred embodiment of the precursor process gas, density of states reducing elements, doping gas, and compensating gas activating and directing instrumentality 48 of the instant invention. In general terms, activation of the precursor process gas, states reducing elements, dopant gas and compensating gas is accomplished in this embodiment by bombardment of the aforementioned gases with ions of a neutral gas such as nitrogen. Accordingly, the activation instrumentality, in the preferred embodiment, is an ion gun adapted to provide a flux of ionized nitrogen atoms which energetically impinge upon and excite the respective one of the precursor process gas or the states reducing element, or the dopant gas, or the compensating gas flowing therethrough.

Such ionic activation of the precursor process gas, the density of states reducing element, the dopant gas or the compensating gas are each accomplished in a discrete activation chamber, generally 60, operatively disposed immediately atop the deposition chamber 41 and operatively communicating therewith via a small passageway 62. It is through such discrete passageways 62 that energetic precursor gas, energetic states reducing elements, energetic dopant gas and energetic compensating gas are individually introduced into the deposition chamber 41 for deposition and reaction on the deposition surface of the web of substrate material 36.

Passing through the interior of and below the upper wall 59 of the deposition chamber 41 of the deposition apparatus 30 is the continuously moving web of substrate material 36 upon which the thin film of semiconductor alloy material will be deposited. The previously described substrate heater assembly 54 which includes a plurality of heating elements 54a for warming the web 36, and the previously described evacuation conduit 52 for removing nondeposited gases are operatively positioned below the web of substrate material 36. Operatively disposed atop, in the preferred embodiment, a major portion of the upper wall 59 of the deposition chamber 41 are the plurality of activation and directing instrumentalities 48 of the instant invention. Also operatively positioned between the upper wall 29 of the deposition chamber 41 and the web of substrate material 36 are one or more spaced sources of radiant energy such as, ultra violet light sources for insuring that the gases deposited on the web 26 will react while in an excited state.

It should be noted that the use of radiant energy such as ultra violet light confers several advantages in the process of the instant invention. By illuminating the deposition surface of the web 26, gases deposited thereupon may be maintained in an excited state which is conducive to further reactions. In this manner, short lived activated species may be practically utilized for the deposition of thin film materials. Additionally, by utilizing radiant energy, specific desired deposition species may be selectively activated so as to control the deposition environment with a high degree of accuracy. As is well known to those of ordinary skill in the art of photochemistry, a specific wavelength of light may be utilized to excite a particular molecular or atomic species rendering that species thererepresent activated. By selecting the appropriate wavelength of light utilized, the deposition environment may be accurately controlled.

As described hereinabove, each of the discrete process gas, density of states reducing element, dopant gas and compensating gas activation and directing instrumentalities 48 are adapted to initiate a flux of energetic inert gas which is directed to impinge upon and excite the respective discrete streams of precursor process gas, density of states reducing elements, dopant gas and compensating gas specifically adapted to flow therethrough. To that end, each of the activation instrumentalities 48 is housed within a compartment 60 which is of dual wall construction in order to electrically isolate the interior of the compartment from the external environment. Accordingly, the compartment 60 comprises a first, electrically conductive enclosure 62 about which an electrically insulating layer 64 is placed so as to cover all external surfaces of said enclosure. At least one, and preferably a plurality of activating gas inlet conduits 66 operatively communicate with one distal end of the interior of the enclosure 62 for conveying the inert, activating ionized gas thereinto. Disposed downstream of the activating gas inlet conduits 66 and occupying the entire cross-sectional area of the interior of the enclosure 62 are a plurality of rectangularly-shaped electrode plates 68, 70 and 72 formed from a gas permeable material such as, for example, a perforated metal or metallic mesh. Downstream of both the activating gas inlet conduits 66 and the rectangularly-shaped electrode plates 68, 70 and 72 is at least one precursor process gas or density of states reducing element, or dopant gas, or compensating gas inlet 74 operatively disposed so as to introduce the process gas or states reducing elements, or dopant gas, or compensating gas into the activation region 76 of the activation instrumentalities 48. It should be noted that the term "process gas", as used herein, is intended and defined to include a single precursor semiconductor process gas, as well as mixtures of precursor semiconductor process gases which are subsequently adapted to be deposited as high quality, specifically tailored, thin films of semiconductor alloy material in accordance with the principles of the instant invention. Note that the precursor process gas will only include the primary semiconductor film-forming gas, because it is desirable that ancillary gases such as density of states reducing elements, dopants gases, deposition facilitating reagents, band gap modifying gases (compensating gases), as well as carrier gases be individually introduced in energized form into the deposition region 50. At the distal, downstream end of the activation instrumentalities 48, the dual-walled compartment 60 bends to form the narrow passageway 62 for placing the activation region 76 of the activating instrumentalities 48 in operative communication with the deposition region 50 of the deposition chamber 41. The activation region 76 must be closely spaced relative to the deposition region 50 so that the activated species of process gas and density of states reducing elements, dopant gas and compensating gas can be combined on the deposition surface of the web of substrate material 36 while in an excited state.

In operation, an activating gas, typically an inert gas such as helium, neon, argon, xenon, nitrogen, or various mixtures thereof, are introduced into the activation instrumentality 48 via the plurality of activating gas inlet conduits 66. The electrode plates 68, 70 and 72 are energized from a voltage supply, (not shown). More particularly, the first electrode plate 68 is preferably energized to a positive potential relative to the potential of the second electrode plate 70. The inert activating gas is introduced into and flows through the permeable electrode plate 68 for ionization thereof in the region between said first and second electrode plates 68 and 70 owing to the electric field established therebetween. The ions of inert gas, typically positively charged ions, are attracted to and pass through the apertures in the negatively charged second electrode plate 70, thus forming the ionized flux of inert energetic activating gas. In the embodiment illustrated in FIG. 3, a third electrode plate 72, referred to herein as an accelerating electrode plate, is provided to impart still further energy to the flux of ionized activating gas. This accelerating electrode plate 72 is energized to a potential that is negative relative to the potential of the second electrode plate 70 for attracting the ionized activating gas which has passed through the apertures in the electrode plate 70. A portion of the ionized activating gas, which has now been further energized, then flows through the apertures in the accelerating electrode plate 72 so as to introduce a flux of inert, highly energetic, ionized, activating gas into each of the activation regions 76 of each of the activating instrumentalities 48.

More particularly, either precursor process gas from a source of precursor gas 74, at least one density of states reducing element from a source of states reducing elements 75, or a dopant gas from a source of dopant gas 77, or a compensating gas from a source of compensating gas 79 is introduced into the activation region 76 from the process gas inlet conduit 74a, or the states reducing element inlet conduit 75a, or the dopant gas inlet conduit 77a, or the compensating gas inlet conduit 79a, respectively. Once in the activation region 76, the precursor process gas, or the states reducing elements, or the dopant gas, or the compensating gas is impinged by the energetic flux of inert activating gas resulting in the energization of the atoms and molecules of said process gas, states reducing elements, dopant gas, or compensating gas. The respective energized gas is swept downwardly through the narrow passageway 62 of the activating instrumentality 48 and into the deposition region 50 of the deposition chamber 51. It is in the deposition region 50 that the process gas, states reducing elements, the dopant gas, and the compensating gas are individually deposited and combined to form a thin film of substantially stress-free, tetrahedrally coordinated, low density of defect states semiconductor alloy material upon the web of substrate material 36 passing therethrough.

Although the operation of the instant invention has been described in terms of employing an energetic beam of ionized, inert gas to individually activate a respective one of the precursor process gas, the states reducing elements, the dopant gas or the compensating gas, the instant invention is not so limited. It may be desirable in some cases to employ a flux of neutral energetic gas for activating the respective precursor gases. In such cases, a filament for neutralizing the charge of the atoms or molecules of inert activating gas may be included in the path of said energetic ionized flux of activating gas. Such neutralization techniques are well-known to those of ordinary skill in the art of vacuum deposition and, hence, greater detail is not necessary. Furthermore, note that the structure of the activating instrumentalities 48, described hereinabove, may be varied in keeping with the spirit of the instant invention, the only requirement being that said instrumentalities be capable of introducing a highly energetic flux of inert activating gas to the activation region 76 thereof. For example, other ion sources, such as a Kauffman ion gun, may be readily employed without departing from the spirit and scope of the instant invention. Likewise, ions of inert activating gas may be created by an externally disposed induction coil which is adapted to charge said activating gas within the activation instrumentalities 48. In some cases, it may be desirable to include one or more magnets to confine, focus, or bend the energetic flux of ionized activating gas so as to prolong the time which the activating gas spends in energizable contact with respective ones of the precursor process gas, the states reducing elements, the dopant gas or the compensating gas.

Figure 4:
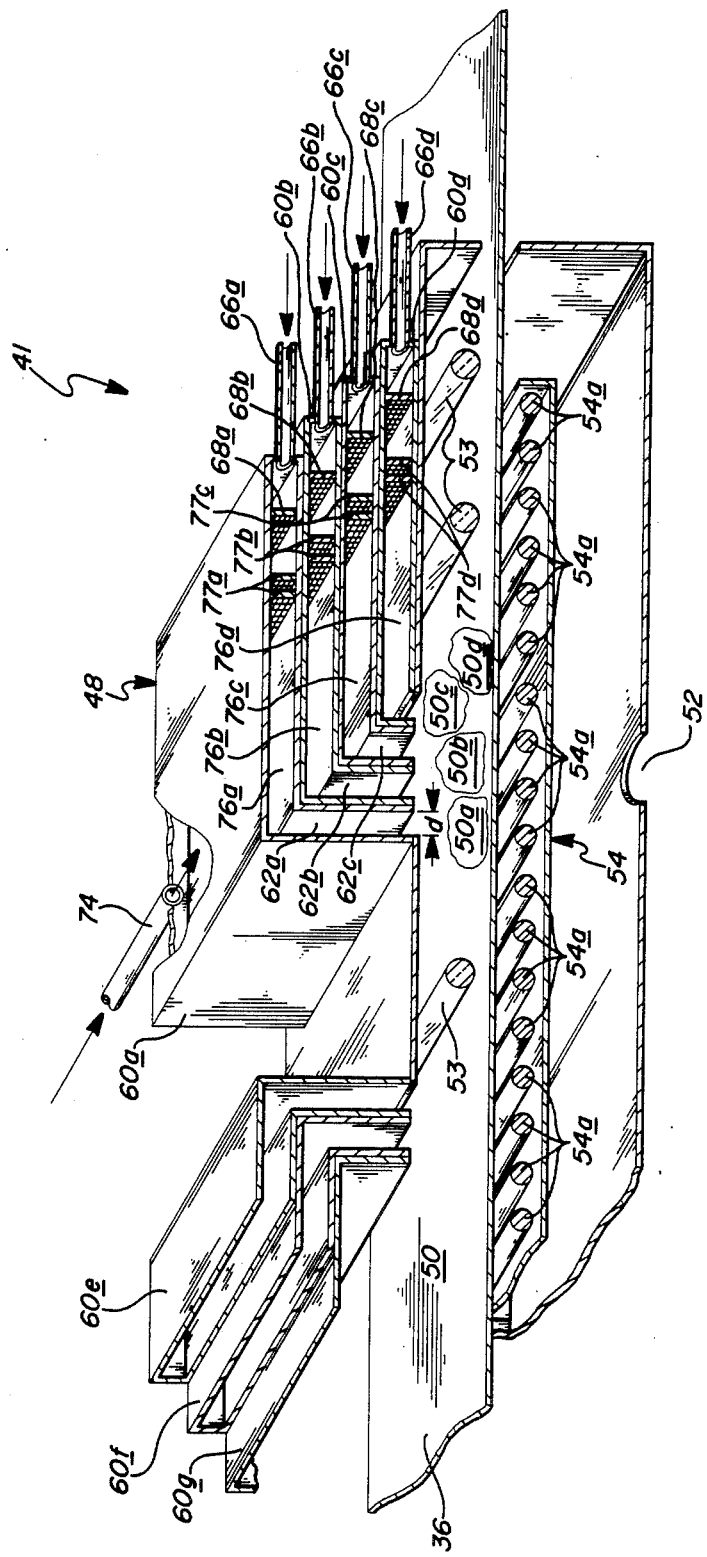

FIG. 4 is an enlarged view and hence more illustrative of the particulars of the deposition chamber of the apparatus depicted in FIGS. 2-3. The apparatus of FIG. 4 shows a single deposition chamber 41 which is specifically adapted to continuously deposit a thin film of stress-free, tetrahedrally coordinated, low density of defect states semiconductor alloy material upon a web of substrate material 36 passing therethrough. The deposition chamber 41 is generally similar to that previously described and illustrated with respect to FIG. 3 and therefore includes an evacuation conduit 52 for removing nondeposited gases, a substrate heater 54 comprising a plurality of heating elements 54a for warming the substrate, and a deposition region 50 in sufficient proximity to the web of substrate material 36 so that energized species of process gas, states reducing elements, dopant gas and compensating gas can be deposited and combined on the deposition surface of the web while the species remain in an activated state. Of course, the spaced sources of ultraviolet light insure that the deposition and combination occurs while said species remain energized.

The embodiment of the invention depicted in FIG. 4 differs from that depicted in FIG. 3 insofar as the activated process gas, states reducing elements, dopant gas and compensating gas are each depicted as individually introduced into the deposition region 50 of the chamber 41 from a plurality of adjacent but discrete process gas activation assemblies, such as 60a–60g, each activation assembly being generally similar in function and structure to the activation assembly 60 previously discussed with reference to FIG. 3. To that end, each activation assembly 60a–60g includes at least one activation gas inlet conduit 66a–66d for introducing the inert activating gas, activating electrode plates such as 68a–d, 70a–d, and 72a–d, for energizing the inert activating gas, a precursor process gas inlet 74 for introducing precursor gas into the activation region 76a of activating assembly 60g, a density of states reducing elements inlet (not shown) for introducing states reducing elements into the activation region 76b of the activating assembly 60b, a dopant gas inlet (not shown) for introducing dopant gas into the activation region 76c of the activating assembly 60c, and a compensating gas inlet (not shown) for introducing compensating gas into the activation region 76d of the activating assembly 60d.

The use of a plurality of activation assemblies, such as 60a–60g, provides for greater control over the deposition process because each discrete activation assembly may be particularly optimized to activate a specific species of precursor process gas, or states reducing elements, or dopant gas, or compensating gas introduced into respective ones of the assemblies. By judiciously selecting the appropriate precursor process gas, or states reducing elements, or dopant gas, or compensating gas, the appropriate inert activating gas, the magnitude and polarity of the charge placed upon the electrode plates 68, 70, 72, particular species may be specifically and individually energized without interference from competing contaminating species so as to have the combination of the specific species which combine to form the semiconductor alloy take place on the deposition surface of the web of substrate material 36. This is accomplished, as described hereinabove, by having one of the activation assemblies, such as assembly 60a, optimized for the energization of the primary precursor process gas, such as silane, the second activating assembly, such as assembly 60b, optimized for energization of the states reducing elements, such as silicon tetrafluoride, an activating assembly, such as assembly 60c, optimized for energization of the dopant gas, such as diborane or phosphine, and the fourth activating assembly, such as assembly 60d, of the set of assemblies optimized for energization of the compensating gas such as carbon or germanium. By then moving the web of substrate material 36 through the deposition region 50a of the deposition chamber 41 adjacent the passageway 62a of the assembly 60a, a thin film of energized precursor gas such as silicon:hydrogen is deposited over a distance d of the web. As the web 36 moves through the deposition region 50b of the deposition chamber 41 formed adjacent the passageway 62b of the assembly 60b, a thin film of the energized density of states reducing elements such as fluorine is deposited on and reacts throughout the bulk of the deposited and still activated silicon and hydrogen material. As the web 36 continues moving through the deposition chamber 41, the silicon:hydrogen:fluorine material enters the deposition region 50c formed adjacent the passageway 62c of the assembly 60c, the energized dopant gas such as boron is deposited on and reacts throughout the bulk of the deposited and still activated silicon:hydrogen:fluorine material. As the web 36 continues moving through the deposition chamber 41, the silicon:hydrogen:fluorine:boron material enters the deposition region 50d formed adjacent the passageway 62d of the assembly 60d, the compensating gas such as germanium is deposited on and reacts throughout the bulk of the deposited and still activated silicon:hydrogen:fluorine:boron material. In this manner, a substantially stress-free, tetrahedrally coordinated, low density of defect states semiconductor alloy is deposited on the web of substrate material 36. A plurality of sets (each set including, preferably, the four discrete activating assemblies 60a–60d) of activating assemblies may be employed to deposit a relatively thick layer of semiconductor alloy material onto the web of substrate material 36. For instance, if the states reducing elements, the dopant element and the compensating element can only diffuse through 500 angstroms of semiconductor material and the layer of semiconductor material must be 3000 angstroms thick, it will be necessary to provide at least six sets of activating assemblies in operative communication with the deposition region 50 in order to deposit a 3000 angstrom thick layer of high quality semiconductor alloy material. Hence, FIG. 4 illustrates a partial second set of activating assemblies 60e–60g to deposit a layer of semiconductor alloy material of greater than, for instance, 500 angstroms thickness.

Additionally, note that difficult to deposit semiconductor alloys may be readily fabricated by the process described hereinabove. For example, in many previous deposition systems, when a mixture of germane and silane is activated, the germanium tends to be deposited at a faster rate than the silicon. Therefore, the precursor germanium silicon process gas stream will quickly be depleted of germanium, thereby making compositional control of finally deposited film difficult. However, if said two primary components of the precursor process gas are activated in discrete, isolated activation assemblies, and only then conveyed to discrete deposition regions, control of composition and configuration of said finally deposited alloy is readily attainable. Note that while the deposition regions 50a–50d have been described as being "discrete", some overlap of adjacent regions may occur. However, the term "discrete" is applicable because each of the deposition regions are primarily dedicated to the deposition of a specific energized species.

Use of multiple activation assemblies also provides for the fabrication of graded and/or profiled layers of semiconductor material. For example, as the web of substrate material 36 travels through the deposition apparatus 41 illustrated in FIG. 4, the first series of activation assemblies 60e–60g (only three assemblies being shown to illustrate a set of activation instrumentalities specifically adapted for the deposition of only three gaseous reactants, as in those cases in which a dopant gas need not be deposited) may be employed to deposit a thin film of semiconductor alloy material of a first composition thereupon, while the second set of activation assemblies 60a–60d may be employed to deposit a subsequent layer of semiconductor alloy material thereatop. In this manner, for example, a semiconductor alloy material having a band gap smoothly varying throughout the thickness thereof (referred to as a graded band gap semiconductor material) may be fabricated. Similarly, a thin film of semiconductor alloy material specifically characterized by varying concentrations of dopant gases throughout the thickness thereof (referred to as profiled doping) may be prepared (note that for this use, a fourth activation assembly would be added to assemblies 60e–60g of the set). Note that while each of the activation assemblies 60a–60g have been described as dedicated to a single specific gaseous reactant, in other instances it may be desirable to use an assembly to energize more than one gaseous reactant, such as to activate the same precursor process gas, state reducing elements, etc. in each of the activation assemblies 60a–60g of the FIG. 4 embodiment of the invention so as to provide a higher rate of deposition.

Because of the fact that the activation assemblies 60 are separated from the deposition region 50, damage to the deposited and depositing material from ionic bombardment, excessive heat, etc. is substantially reduced. Further, said separation of the activation regions of the assemblies from the deposition regions of the chamber provides for different pressure regimes to be established and maintained in the two regions. More particularly, the activation regions 60 may be maintained at a relatively high pressure so as to facilitate activation of the precursor process gas, states reducing elements, dopant gas, and compensating gas, while the deposition regions 50 may be maintained at substantially lower pressures to prevent contamination of the deposited or depositing material.

Numerous modifications of the previously described embodiments of the instant invention may be undertaken without departing from the spirit or scope thereof. For example, in some cases it may be desirable to activate the precursor process gases, or states reducing elements, or dopant gas, or compensating gas in close proximity to the web of substrate material 36 by providing substantially coextensive deposition and activation regions. Such a modification of the activation assemblies 60 may be readily accomplished by projecting the energetic flux of inert activating gas in a plane generally parallel to but slightly spaced from the web of substrate material 36. Ions of the inert activating gas will then impinge upon the precursor process gas, states reducing elements, dopant gas, or compensating gas in close proximity to the web of substrate material 36, thus providing for the utilization of extremely reactive species (species having short excited lifetimes) in the deposition process. In another embodiment of the instant invention, a portion of the precursor process gas, the states reducing elements, the dopant gas, or the compensating gas, themselves, are utilized as the activating gas. That is to say, a portion of the precursor gases, states reducing elements, dopant gas or compensating gas are energized and directed to impinge upon and activate the remainder of the respective gaseous reactants. In still a further embodiment of the instant invention, the technique of utilizing activated precursor process gas, states reducing elements, dopant gas, or compensating gas to deposit a thin film is combined with other deposition technologies (such as evaporation, sputtering, chemical vapor deposition, glow discharge deposition, etc.). In such combination-deposition method cases, the activated precursor process gas, states reducing elements, dopant gas or compensating gas are directed into the deposition region in which the aforementioned process occurs.

It should be apparent from the foregoing description that the present invention provides for the fabrication of amorphous semiconductor alloy materials having (1) a low density of defect states (below $10^{15}$cm$^{-3}$) in the energy gap thereof, (2) a high degree of local order, (3) tetrahedral coordination, and (4) substantially stress-free and unstrained bonding.

In order to continuously produce the improved semiconductor alloys described herein, without resorting to the conventional plasma deposition processes previously utilized in an attempt to produce high quality amorphous silicon alloy materials, a specifically designed UHV technique has been developed. The defects of silicon due to undercoordination can be substantially eliminated through the use of the production techniques described herein, especially where silicon is utilized as an alloying agent in combination with narrow band gap semiconductor materials. The present invention also contemplates the incorporation of precursor materials and compensating elements in layers as the semiconductor alloy is deposited to provide further control of the properties of the depositing semiconductor alloy.

The foregoing description is merely meant to be illustrative of the instant invention, and not a limitation upon the practice thereof. Numerous variations and modifications of the disclosed embodiments of the instant invention are possible. It is the following claims, including all equivalents which define the scope of the instant invention.

What we claim is:

1. A method of continuously depositing thin films of high quality semiconductor alloy material, said method comprising the steps of:
   providing a deposition chamber;
   maintaining a reduced pressure within the chamber;
   providing a plurality of activation regions in the chamber;
   providing at least one deposition region in the chamber, sdid deposition region proximately disposed relative to the activation regions;
   movingly disposing substrate material in the deposition region for the continuous deposition of semiconductor alloy material thereupon;
   introducing semiconductor precursor material into one of the activation regions;
   introducing density of states reducing material into a different one of the activation regions;
   exciting the semiconductor precursor material and the states reducing material in respective ones of the activation regions by a flux of energetic gas; and,
   directing the activated semiconductor precursor material and the states reducing material to the deposition region within the lifetime of the activated species, whereby a thin film of semiconductor material characterized by specifically tailored properties, including a low density of defect states, tetrahedral coordination and substantially stress-free bonding, is continuously deposited onto the substrate material.

2. A method as in claim 1, wherein said energetic gas selected from the group consisting essentially of: helium, neon, argon, xenon, nitrogen and combinations thereof.

3. A method as in claim 2, wherein an ionized flux of gas is provided.

4. A method as in claim 2, wherein a neutral flux of gas is provided.

5. A method as in claim 2, wherein an electromagnetic field is employed to direct the flux of energetic gas.

6. A method as in claim 2, wherein a magnetic field is employed to direct the flux of energetic gas.

7. A method as in claim 2, wherein
   a low pressure is maintained in the deposition region, said pressure being lower than the pressure in the activation regions, so as to (1) promote collisions between molecules of the semiconductor precursor material, the states reducing material and atoms of the energetic gas in the activation regions; and (2) increase the activated lifetime of activated species in the deposition region.

8. A method as in claim 7, including the further steps of:
   maintaining the activation regions at a pressure greater than 0.5 torr;
   maintaining the deposition region at a pressure less than 10 millitorr.;
   providing a plurality of proximately disposed directing means.

9. A method as in claim 2, wherein an ion gun is employed to provide a flux of energetic gas for exciting the precursor materal and the states reducing material.

10. A method as in claim 1, wherein the semiconductor precursor material is selected, from the group consisting essentially of: silicon tetrafluoride, germanium tetrafluoride, germane, silane, fluorine and hydrogen.

11. A method as in claim 10, wherein at least a third activation region is provided and a dopant gas is introduced into the third activation region.

12. A method as in claim 10, wherein at least a third activation region is provided and a compensating gas is introduced into the third activation region.

13. A method as in claim 1, including the further steps of:
   introducing activated precursor material and states reducing material from the plurality of directing means along a major portion of the path of travel which is traversed by the substrate material through the deposition chamber.

14. A method as in claim 1, including the further step of: providing a flux of energetic gas into discrete activation regions from a plurality of discrete flux providing means;
   introducing a material selected from the group consisting essentially of a precursor semiconductor material, a density of states reducing material, a dopant material, or a compensating material for excitation in each discrete activation region; and
   individually introducing said excited precursor material, said excited density of states reducing material, said dopant material, or said compensating material into the deposition region for combination on the deposition surface of the substrate material.

15. A method as in claim 1, wherein the step of maintaining the substrate at an elevated temperature comprises maintaining the substrate at a temperature of 100°–500° C.

16. A method as in claim 1, including the further steps of: providing a source of radiant energy in the deposition region proximate the web of substrate material; and, illuminating the deposition region so as to selectively excite one of the activated species in the deposition region.

17. A method of depositing thin films of high quality semiconductor alloy material comprising the steps of:
   providing a deposition chamber;
   maintaining a reduced pressure within the chamber;
   providing at least one activation region;
   providing at least one deposition region in the chamber, said deposition region operatively communicating with and proximately disposed relative to the activation region;
   disposing substrate material in the deposition region;
   providing a multi-component precursor gaseous mixture; said mixture including at least (1) a source of precursor semiconductor material, and (2) a source of at least one precursor density of states reducing material;
   introducing at least the precursor semiconductor material into said activation region;
   exciting the precursor component by a flux of energetic gas for activating at least one judiciously preselected species thereof; and
   directing the activated preselected species into the deposition region within the lifetime of said activated species so as to deposit and combine the species on the deposition surface of the substrate material for fabricating a thin film of semiconductor alloy material characterized by specifically tailored properties including a low density of defect states, tetrahedral coordination and substantially stress-free bonding.

18. A method as in claim 17, including the further step of incorporating source of a second precursor density of states reducing material in the precursor gaseous mixture.

19. A method as in claim 18, including the further step of selecting semiconductor material from the group consisting essentially of silicon-containing gas, germanium-containing gas and conbination thereof.

20. A method as in claim 19, including the further step of providing hydrogen gas as the first density of states reducing material and fluorine gas as the secondary density of states reducing material.

21. A method as in claim 20, wherein the semiconductor material is a silicon-containing gas and the silicon-containing gas, the hydrogen gas and the fluorine gas are introduced into the same activation region for excitation of preselected species.

22. A method as in claim 20, wherein the semiconductor material is a silicon-containing gas and a germanium-containing gas and the silicon-containing gas, the germanium-containing gas, the hydrogen gas and the fluorine gas are introduced into the same activation region for excitation of preselected species.

23. A method as in claim 20, wherein the semiconductor material is a germanium-containing gas and the germanium-containing gas, the hydrogen gas and the fluorine gas are introduced into the same activation region for excitation of preselected species.

24. A method as in claim 20, including the further steps of providing at least one additional activation region;

introducing at least one component of the precursor gaseous mixture into the additional activation region;

exciting the introduced components of the additional activation region to activate additional preselected species; and separately directing, the preselected species and the additional preselected species into the deposition region within the lifetime of those species so as to combine and deposit those species on the substrate material.

25. A method as in claim 20, including the further step of exciting the introduced component by energy transfer from an activated gas.

26. A method as in claim 20, including the further step of exciting the introduced component by photon radiation.

* * * * *